United States Patent
Shoki

(10) Patent No.: US 6,960,412 B2
(45) Date of Patent: Nov. 1, 2005

(54) REFLECTIVE-TYPE MASK BLANK FOR EXPOSURE, METHOD OF PRODUCING THE SAME, AND REFLECTIVE-TYPE MASK FOR EXPOSURE

(75) Inventor: Tsutomu Shoki, Tama (JP)

(73) Assignee: Hoya Corporation, Tokyo (JP)

( * ) Notice: Subject to any disclaimer, the term of this patent is extended or adjusted under 35 U.S.C. 154(b) by 85 days.

(21) Appl. No.: 10/370,716

(22) Filed: Feb. 24, 2003

(65) Prior Publication Data
US 2003/0162104 A1 Aug. 28, 2003

(30) Foreign Application Priority Data

| Feb. 22, 2002 | (JP) | ............................................. 2002-046145 |
| Dec. 5, 2002 | (JP) | ............................................. 2002-353659 |

(51) Int. Cl.[7] ................................................ G01F 9/00
(52) U.S. Cl. ............................................................ 430/5
(58) Field of Search ............................... 430/5; 428/428, 428/433; 378/34, 35

(56) References Cited

U.S. PATENT DOCUMENTS
6,737,201 B2 * 5/2004 Shoki et al. .................... 430/5

FOREIGN PATENT DOCUMENTS
JP         8-213303         8/1996

* cited by examiner

Primary Examiner—S. Rosasco
(74) Attorney, Agent, or Firm—Sughrue Mion, PLLC

(57) ABSTRACT

In a reflective-type mask blank (10) for exposure which blank includes a substrate (1) having a principal surface, a reflective multilayer film (2) formed on the principal surface, and an absorber film (4) formed on the reflective multilayer film, an intermediate layer (3) is interposed between the reflective multilayer film and the absorber film and is resistant against an etching environment of the absorber film. The intermediate layer is made of a material comprising Ta as a main metal component. The reflective multilayer film is for reflecting exposure light which travels from the outside of the reflective-type mask blank towards the principal surface. The absorber film is for absorbing the exposure light.

8 Claims, 2 Drawing Sheets

REFLECTIVE-TYPE MASK BLANK FOR EXPOSURE, METHOD OF PRODUCING THE SAME, AND REFLECTIVE-TYPE MASK FOR EXPOSURE

BACKGROUND OF THE INVENTION

This invention relates to an exposure technique used in pattern transfer in a semiconductor process and, in particular, to a reflective-type mask blank for exposure, a method of producing the same, and a reflective-type mask for exposure.

In the semiconductor industry, a pattern transfer technique is required when an integrated circuit comprising fine or microscopic patterns is formed on an Si substrate or the like. As the pattern transfer technique, use has been made of photolithography utilizing visible light or ultraviolet light. In recent years, accelerated development of a semiconductor device more and more miniaturized and having finer patterns requires a shorter wavelength as an exposure wavelength so as to achieve higher resolution. However, limitation is imposed upon pursuit of a shorter wavelength in existing optical exposure using the above-mentioned photolithography so that the limit of resolution is approaching.

In case of the photolithography, it is known that the limit of resolution in pattern transfer generally corresponds to a half of the exposure wavelength. It is predicted that, even if an $F_2$ laser beam having a wavelength of 157 nm is used, the limit of resolution is on the order of 70 nm. As an exposure technique capable of achieving higher resolution, an EUV (Extreme Ultra Violet) lithography using EUV light is promising. The EUV light has a wavelength shorter than that of the $F_2$ laser beam. It is noted here that the EUV light, which is described in the present specification, is a radiation having a wavelength within a soft X-ray region or a vacuum ultraviolet region, specifically, a wavelength within a range between about 0.2 and 100 nm.

For the EUV light, all substances exhibit high absorption and have a refractive index approximately equal to 1. Consequently, in the EUV lithography, a refraction optical system used in the photolithography can not be used but a reflection optical system is exclusively used. In the reflection optical system, a reflective-type mask is used as a mask (see, for example, a reflective X-ray mask disclosed in Japanese Unexamined Patent Publication No. H08-213303 (JP 8-213303 A)).

The reflective-type mask generally comprises a substrate, a reflective multilayer film formed on the substrate for reflecting light, an intermediate layer formed on the reflective multilayer film, and an absorber film having a predetermined pattern and formed on the intermediate layer to absorb light. Light incident to the reflective-type mask is partially absorbed by the absorber film in an area where the absorber film is present and is partially reflected by the reflective multilayer film in a remaining area where the absorber film is not present. The former area and the latter area may be referred to as an absorption region and a reflection region, respectively. A reflected image formed by the light reflected by the reflective multilayer film is transferred through the reflection optical system onto a wafer. Herein, the intermediate layer serves to protect the reflective multilayer film when the pattern of the absorber film is formed by the use of dry etching or the like in a mask production process. As a material of the intermediate layer, use is often made of $SiO_2$ because $SiO_2$ is excellent in etching selectivity with respect to the absorber film of Cr or the like, readily available, and easy in handling. Generally, in order to increase the reflectivity for exposure light, the intermediate layer formed on the reflection region of the mask (the area where the pattern of the absorber film is not formed) is completely removed after forming the pattern of the absorber film.

However, if the intermediate layer is formed by the material such as $SiO_2$ mentioned above, it is difficult to control an internal stress of the intermediate layer so that a residual stress is produced. As a consequence, the reflective multilayer film is deformed, for example, distorted or warped. This results in degradation in reflection characteristic. In addition, $SiO_2$ has a large surface roughness. Consequently, the absorber film formed thereon has a roughened surface. This results in an increase in edge roughness of the pattern of the absorber film so that the dimensional accuracy of the pattern of the absorber film is decreased.

SUMMARY OF THE INVENTION

It is therefore an object of this invention to provide a reflective-type mask blank which uses as an intermediate layer a material easy in controlling a film stress so as to produce an mask prevented from being deformed to cause degradation in transfer accuracy.

It is another object of this invention to provide a reflective-type mask blank which uses as an intermediate layer high in smoothness and flatness so as to prevent degradation in dimensional accuracy of a pattern of an absorber film.

The present inventors have found out that the above-mentioned objects can be achieved by using, as an intermediate layer, a novel material containing Ta as a main metal element.

Reflective-type mask blanks according to this invention and a method according to this invention are as follows:

1) A reflective-type mask blank (10) for exposure which blank comprises:

a substrate (1) having a principal surface;

a reflective multilayer film (2) formed on the principal surface for reflecting exposure light which travels from the outside of the reflective-type mask blank towards the principal surface; and an absorber film (4) formed on the reflective multilayer film for absorbing the exposure light;

wherein the blank further comprises:

an intermediate layer (3) which is interposed between the reflective multilayer film and the absorber film and which is resistant against an etching environment of the absorber film, the intermediate layer being made of a material comprising Ta as a main metal component.

2) A reflective-type mask blank as described in Item 1), wherein the material of the intermediate layer further comprises B as another component.

3) A reflective-type mask blank as described in Item 1), wherein the intermediate layer has an amorphous structure or a fine crystal structure.

4) A reflective-type mask blank as described in Item 1), wherein the absorber film is made of a material comprising Cr as a main metal component.

5) A reflective-type mask blank as described in Item 4, wherein the material of the absorber film further comprises at least one element selected from the group consisting of N, O, and C.

6) A reflective-type mask produced by forming a transfer pattern in the absorber film of a reflective-type mask blank as described in any one of Items 1 to 5.

7) A method of producing a reflective-type mask blank for exposure, which method comprises the steps of:

preparing a substrate having a principal surface;

forming on the principal surface a reflective multilayer film reflecting exposure light which travels from the outside of the reflective-type mask blank towards the principal surface; and forming on the reflective multilayer film an absorber film absorbing the exposure light to thereby obtain the reflective-type mask blank;

wherein the method further comprises the step of:

forming an intermediate layer which is interposed between the reflective multilayer film and the absorber film and which is resistant against an etching environment of the absorber film, the intermediate layer being formed by using a material comprising Ta as a main metal component, by preliminarily obtaining stress distribution of a reflective-type mask as a final product using the reflective-type mask blank, and controlling, on forming the intermediate layer, a film stress of the intermediate layer on the basis of the stress distribution so that the reflective-type mask is prevented from being deformed.

DESCRIPTION OF THE PREFERRED EMBODIMENTS

Figure 1:
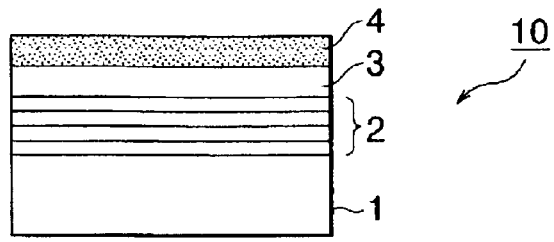
FIG. 1 is a sectional view of a reflective-type mask blank according to an embodiment of this invention.

Now, description will be made of a reflective-type mask blank and a reflective-type mask according to embodiments of this invention. In the reflective-type mask blank of this invention, a reflective multilayer film is formed on a principal surface of a substrate. An intermediate layer made of a material containing Ta as a main metal element is formed on the reflective multilayer film. An absorber film is formed on the intermediate layer. The reflective-type mask blank of this invention can be produced by successively depositing, on the substrate, the reflective multilayer film, the intermediate layer, and the absorber film by using sputtering or the like.

Substrate

The substrate is preferably made of a material having a low coefficient of thermal expansion within a range of $0\pm1.0\times10^{-7}/°$ C., more preferably, within a range of $0\pm0.3\times10^{-7}/°$ C. in order to prevent distortion of a pattern due to heat generation during exposure. As a material having such a low coefficient of thermal expansion within the above-mentioned range, use may be made of an amorphous glass, glass-ceramics, and a metal. For example, the amorphous glass may be a $SiO_2$—$TiO_2$ glass or a silica glass. The glass-ceramics may be one containing β-quartz solid solution. The metal may be an Invar alloy (Fe—Ni alloy). The substrate preferably has a high smoothness and a high flatness so as to obtain a high reflectivity and a high transfer accuracy. In particular, the substrate preferably has a roughness of 0.2 nmRms or less in a 10 μm-square area and a flatness of 100 nm or less in a 142 mm-square area.

The substrate preferably has a high rigidity In order to prevent deformation due to a film stress of the film formed on the substrate. In particular, the substrate preferably has a high Young's modulus of 65 GPa or more. The index Rms representative of the roughness in the present invention is a mean square roughness and can be measured by an atomic force microscope. The flatness in the present invention is a value representative of surface warp (deformation) given by TIR (Total Indicated Reading). This value is obtained as follows. A focal plane is defined as a plane determined by a least square method with respect to the surface of the substrate. Calculation is made of a difference in level between a highest position and a lowest position of the surface of the substrate above and below the focal plane, respectively. An absolute value of the above-mentioned difference is given as the flatness.

Reflective Multilayer Film

The reflective multilayer film of this invention has a structure in which a plurality of kinds of substances different in refractive index are periodically laminated. The reflective multilayer film is adapted to reflect light having a specific wavelength. For exposure light having a wavelength of, for example, about 13 nm, use can be made of the reflective multilayer film comprising a lamination of about 40 periods of alternate layers of Mo and Si.

For example, the reflective multilayer film used in a region of EUV light may be a Ru/Si periodic reflective multilayer film, a Mo/Be periodic reflective multilayer film, a Mo-compound/Si-compound periodic reflective multilayer film, a Si/Nb periodic reflective multilayer film, a Si/Mo/Ru periodic reflective multilayer film, a Si/Mo/Ru/Mo periodic reflective multilayer film, and a Si/Ru/Mo/Ru multilayer periodic reflective film. The material of the reflective multilayer film may be appropriately selected in dependence upon the wavelength of the exposure light.

The reflective multilayer film can be formed on the substrate, for example, by DC magnetron sputtering. For example, if the reflective multilayer film comprises Mo and Si, sputtering is carried out in an Ar gas atmosphere with a Si target and a Mo target alternately used to deposit 30 to 60 periods, preferably, 40 periods of alternate layers of Si and Mo. Finally, a Si film is deposited as a topmost layer. Alternatively, use may be made of IBD (Ion Beam Deposition).

Intermediate Layer

The intermediate layer of this invention is resistant against an etching plasma used when the absorber film is selectively etched. The intermediate layer is made of a material containing Ta as a main metal element. Herein, "Ta as a main metal element" means that, among metal elements contained in the material, Ta has a greatest composition ratio. The material containing Ta as a main metal element and used for the intermediate layer of this invention is a metal containing Ta alone or a Ta-based alloy. The material containing Ta as a main metal element is easy in control of an internal stress and excellent in surface smoothness and flatness.

Thus, the material containing Ta as a main metal element is used as the material of the intermediate layer. With this structure, it is possible to obtain a reflective-type mask free from distortion of the surface of the reflective multilayer film, excellent in smoothness and flatness, and suppressed in degradation of reflective characteristics and to obtain a reflective-type mask blank for use in producing the reflective-type mask. These effects are enhanced by adopting a amorphous structure or a fine crystal structure. The amorphous structure or the fine crystal structure of the type can easily be achieved by addition of B, Si, or Ge to Ta. In case where the amorphous structure or the fine crystal structure is adopted, the roughness of 0.2 nmRms or less can be obtained.

The material containing Ta and B is particularly preferable. In this event, the fine crystal structure or the amorphous structure is obtained by selecting the ratio of Ta/B within a range between 8.5/1.5 and 7.5/2.5. Specifically, Ta4B containing 20% B easily forms the amorphous structure and achieves excellent smoothness and flatness. Ta4B has an absorption coefficient of 0.038 for the light having a wavelength of 13.4 nm.

In order to impart various characteristics, the material containing Ta as a main metal element may contain oxygen and/or nitrogen in addition to the metal elements mentioned above. For example, use may be made of a material containing Ta and N, a material containing Ta, B, and O, a material containing Ta, B, and N, a material containing Ta, B, N, and O, a material containing Ta and Si, a material containing Ta, Si, and N, a material containing Ta and Ge, and a material containing Ta, Ge, and N. For example, addition of N or O to Ta improves oxidization resistance so as to improve stability over time.

Among those materials, the material containing Ta, B, and N is preferable in view of stress control. If the material contains 5–30 at % N and, with respect to the balance assumed to be 100, 10–30 at % B, the amorphous structure or the fine crystal structure can readily be obtained. For example, the material of the amorphous structure can be obtained by addition of 15 at % B and 10 at % N to Ta as a main component. This material has an absorption coefficient of 0.036 with respect to the exposure light having a wavelength of 13.4 nm. Inclusion of N improves the oxidization resistance.

The intermediate layer of this invention may be left on the reflection region (where the pattern of the absorber film is not formed) of the mask or may completely be removed. If the intermediate layer is left, the exposure light passes through the intermediate layer. Therefore, in order to suppress a decrease in reflectivity, the material of the intermediate layer preferably has an absorption coefficient as small as possible. On the contrary, if the intermediate layer in the reflection region of the mask can be removed, the material may have a relatively large absorption coefficient. In this event, it is possible to use those materials excellent in various characteristics other than the absorption coefficient. Thus, the material of the intermediate layer can be selected over a wide range.

The intermediate layer of this invention is advantageous also in the following respect because of its excellent absorption characteristic. Generally, in the reflective-type mask, the exposure light is not incident in a direction perpendicular to the mask but is incident at an incident angle of several degrees with respect to the mask. Therefore, if the pattern of the mask is thick, a shadow or shade of the pattern itself is produced at an edge portion of the pattern. In this event, the dimensional accuracy of the pattern is degraded and a reflected image becomes unclear. Taking the above into consideration, the thickness of the pattern itself is preferably as small as possible. In the absorption region of the mask, the absorber film and the intermediate layer are laminated. Therefore, it is required to reduce the total thickness of the absorber film and the intermediate layer.

To this end, the exposure light is absorbed not only by the absorber film but also by the intermediate layer given the function of absorbing the exposure light so that the exposure light is sufficiently absorbed by a combination of the absorber film and the intermediate layer as a whole. Based of the above-mentioned concept, the thickness of the intermediate layer and the absorber film is designed. In this event, if the intermediate layer is made of the material having a relatively large absorption coefficient, the thickness of the intermediate layer may be reduced. If the intermediate layer is not reduced or changed in thickness, the absorbability of the intermediate layer is increased so that the thickness of the absorber film can be reduced. As a result, the total thickness of the intermediate layer and the absorber film can be reduced so as to suppress the above-mentioned problem of shadow of the pattern. Preferably, the total thickness of the intermediate layer and the absorber film is not greater than 100 nm.

In view of the above, if the intermediate layer except the absorber film is removed later, the absorption coefficient of the intermediate layer with respect to the exposure wavelength is preferably equal to 0.025 or more, more preferably, 0.030 to 0.041. The material containing Ta alone has an absorption coefficient of 0.041 for the light having a wavelength of 13.4 nm. As the absorption coefficient for the exposure wavelength is higher, the intermediate layer can be reduced in thickness so that the above-mentioned problem of shadow of the pattern itself can be avoided. For example, if the absorber film of CrN has a thickness of 50 nm, the thickness of the intermediate layer of this invention can be reduced to 50 nm or less.

On the other hand, if the intermediate layer is left in the reflection region of the mask, the intermediate layer is preferably as thin as possible within a range such that the thickness required as an etch stopper is assured, in order to suppress the decrease in reflectivity. The thickness of the intermediate layer is preferably equal to 10 nm or less, more preferably, 5 nm or less.

In order to produce the film containing Ta as a main metal element, use is preferably made of sputtering. If the film is formed by sputtering, an internal stress can easily be controlled by changing supply power supplied to a sputter target or a deposition pressure. The internal stress is controlled so that, in the state of the reflective-type mask formed by selectively etching the absorber film of the reflective-type mask blank, stresses of the substrate, the pattern of the absorber film, the reflective multilayer film, and the intermediate layer are kept in equilibrium and a resultant total stress does not cause deformation of the mask. The sputtering is also advantageous in that the influence of heat upon the reflective multilayer film or the like is suppressed because the film can be produced at a low temperature around the room temperature.

Control of Internal Stress in Intermediate Layer

The resultant total stress as a combination of the stresses in various films and the substrate of the reflective-type mask is a factor causing deformation of the reflective-type mask. The stresses of the various films and the substrate in the reflective-type mask as a final product depend upon the kinds of the materials, the thickness of each film, and the thickness of the substrate and can preliminarily be obtained by experimental tests and simulations. The intermediate layer in this invention is easy in control of the internal stress. Therefore, if the stresses of the other films and the substrate are preliminarily obtained, the resultant total stress is adjusted by easily controlling the internal stress of the intermediate layer so that deformation of the mask as the final product is suppressed.

At first, description will be made in detail about control of the internal stress of the intermediate layer in case where the intermediate layer alone is a factor causing the deformation of the mask. If the intermediate layer comprises a film containing Ta and B, use may be made of reactive sputtering in which a target containing tantalum and boron or a target containing tantalum alone is used as a sputter target and a gas containing boron atoms (for example, diborane) is mixed in a sputter gas. For example, in case of a Ta4B film, the internal stress tends to be compressive and tensile if the supply power supplied to the target is increased and decreased, respectively. The supply power can be controlled very precisely. By accurately controlling the supply power, it is possible to adjust the internal stress of a deposited film as the intermediate layer so that the internal stress is substantially equal to zero. As a consequence, the mask as the final product can be prevented from being deformed by the film stress.

Next, description will be made of control of the internal stress of the intermediate layer in case where the stress causing the deformation of the mask is produced in any other film except the intermediate layer. For example, if the internal stress of the type is produced in the absorber film, the stress of the intermediate layer is controlled to have a value canceling the stress of the absorber film formed on the intermediate layer. In other words, by combining the film stress of the intermediate layer and the film stress of the absorber film so that they are canceled by each other, the total film stress of the intermediate layer and the absorber film formed on the reflective multilayer film can be suppressed. Thus, if the film stresses of those pattern-forming layers on the reflective multilayer film are adjusted so that the total film stress is substantially equal to zero as a whole, the positional accuracy of the transfer pattern can be kept high.

In order to make the total film stress of the intermediate layer and the absorber film be substantially equal to zero, the film stress of the intermediate layer is adjusted to be opposite in direction and equal in magnitude to the film stress of the absorber film. The stress of the film is determined by a product of the film thickness and the internal stress per unit film thickness. Therefore, by adjusting these values, a desired film stress can be obtained.

For example, in case where the absorber film is made of a material containing Cr having a tensile stress as a main metal component (for example, a material containing Cr and N), the intermediate layer made of a material containing Ta as a main metal element (for example, a material containing Ta and B) is given a compressive stress. In this manner, the total stress can be adjusted to be equal to zero. Thus, without requiring the film stress of the material of each individual layer to be adjusted to zero, the reflective multilayer film can be effectively prevented from being distorted or warped so that the positional accuracy of the pattern can be kept high.

The absorber film of this invention is made of a material absorbing the exposure light. As the material of the type, use may be made of a material containing Cr, Ti, W, or the like as a main component. The absorber film of the type can be formed, for example, by sputtering such as DC magnetron sputtering. In addition, the absorber film preferably has a high etching selectivity of the absorber film with respect to the intermediate layer made of the material containing Ta as a main metal element. In view of the above, the absorber film is preferably made of a material containing Cr as a main metal. By the use of the absorber film made of the material containing Cr as a main metal, the etching selectivity of the absorber film with respect to the intermediate layer made of the material containing Ta as a main metal element can be sufficiently increased. As a consequence, the thickness of the intermediate layer can further be reduced.

Since the thickness of the intermediate layer can be reduced, the problem of shadow of the pattern itself during exposure can be eliminated. In case where the intermediate layer left in the reflection region of the mask is removed during formation of the mask, it is possible to reduce the amount of overetching and to shorten the time during which the reflective multilayer film is etched when the intermediate layer is removed. Thus, it is possible to minimize a damage upon the reflective multilayer film.

Underlayer of Intermediate Layer

As described above, the intermediate layer in the reflection region can completely be removed in this invention. In this case, an underlayer durable against the etching environment of the intermediate layer may be formed as an etch stopper layer between the intermediate layer and the reflective multilayer film. By forming the underlayer, it is possible to remove the intermediate layer without damaging the reflective multilayer film.

As the underlayer, use may be made of a material which has a high etching selectivity (preferably, 10 or more) with respect to the intermediate layer made of the material containing Ta as a main metal element, which is low in stress, and which is resistant against a chemical solution used in mask cleaning. As the material of the type, use may be made of a material containing Cr as a main metal element. Preferably, the material contains Cr alone or Cr and at least one element selected from the group consisting of N, O, and C. Specifically, the above-mentioned material used for the absorber film of this invention can be used.

In addition, the material containing Cr as a main metal element can easily be removed by wet etching using a Cr parting solution. Therefore, the material is advantageous in that the underlayer can be removed in a removing step (which will later be described) without damaging the reflective multilayer film at all and that the pattern on the reflective multilayer film can readily been separated when the reflective multilayer film is re-used or recycled. The underlayer in the reflection region of the mask may be left on the reflective multilayer film or may be removed in conformity with the patterns of the absorber film and the intermediate layer when the reflective-type mask is finally produced.

In case where the underlayer is left on the reflective multilayer film, the underlayer is preferably as thin as possible within a range assuring the resistance against etching of the intermediate layer, in order to suppress the decrease in reflectivity. In this case, the thickness of the underlayer is preferably between about 1 and 5 nm. In this case, the absorption coefficient of the underlayer is preferably equal to 0.038 or less in order to suppress the decrease in reflectivity. By leaving the underlayer on the reflective multilayer film, the underlayer also serves as a protection film for protecting the reflective multilayer film during mask cleaning.

On the other hand, in case where the underlayer is removed in conformity with the patterns of the absorber film and the intermediate layer, the underlayer preferably has a thickness between 1 and 10 nm in order to assure etch resistance and pattern accuracy as required. In this case, the absorption coefficient of the underlayer is preferably equal to 0.030 or more in view of the above-mentioned problem of shadow of the pattern itself. In this case, by designing the film stresses of the respective layers so that the film stresses of the underlayer, the intermediate layer, and the absorber film are cancelled with one another and the total film stress is substantially equal to zero, the deformation of the mask is prevented and the positional accuracy of the pattern can be kept high.

The underlayer can be removed by wet etching or dry etching. By the use of the wet etching, the underlayer can be removed without damaging the reflective multilayer film at all. In case where the underlayer is removed by dry etching, the underlayer to be removed is thin so that only a short etch time is required. As compared with the case where the thick intermediate layer is directly removed without the underlayer, the reflective multilayer film is less damaged.

Thus, in case where the underlayer is removed, the reflective multilayer film is not substantially damaged and the reflective-type mask minimized in decrease of the reflectivity can be obtained. The reflective-type mask blank and the reflective-type mask of this invention are based on the assumption that the above-mentioned EUV light having a wavelength of 0.2 to 100 nm is used as the exposure light but may appropriately be used for light having a different wavelength. As the material of the absorber film of this invention, use may be made of a material containing Cr alone and a material containing Cr and at least one element selected from the group consisting of N, O, and C. For example, $Cr_{1-x}N_x$ (preferably, $0.05 \leq x \leq 0.5$), $Cr_{1-x}O_x$ (preferably, $0.05 \leq x \leq 0.6$), $Cr_{1-x}C_x$ (preferably, $0.05 \leq x \leq 0.4$), $Cr_{1-x-y}N_xC_y$ (preferably, $0.05 \leq x \leq 0.45$, $0.01 \leq y \leq 0.3$), and $Cr_{1-x-y-z}N_xO_yC_z$ (preferably, $0.05 \leq x \leq 0.40$, $0.02 \leq y \leq 0.3$, $0.01 \leq z \leq 0.2$) may be used.

Combination of Intermediate Layer and Absorption Film

In this invention, a preferable combination of the absorber film and the intermediate layer is a combination of the absorber film containing Cr, O, and N and the intermediate layer containing Ta, B, and N. In view of formation of the intermediate layer reduced in thickness, the absorber film is selected so that the etching selectivity with respect to the intermediate layer containing Ta as a main metal element is 5 or more, preferably 10 or more, more preferably 20 or more. In this invention, the thickness of the absorption layer is typically about 50 nm. The total thickness of the absorber film and the intermediate layer is preferably equal to 100 nm or less in order to prevent the problem of the shadow of the pattern itself.

Production of Reflective Mask

Next, description will be made of the reflective-type mask according to this invention. The reflective-type mask of this invention can be produced by forming a pattern on the absorber film of the reflective-type mask blank described above. Pattern formation is carried out by depositing an EB resist layer on the reflective-type mask blank, forming a resist pattern by EB writing, and etching the absorber film by dry etching or the like with the resist pattern used as a mask. In case where the absorber film is made of a material containing Cr as a main metal, pattern formation may be carried out, for example, by dry etching using chlorine and oxygen, with the intermediate layer used as a protection layer for the reflective multilayer film.

In case where the intermediate layer in the reflection region of the mask is removed, the intermediate layer containing Ta as a main metal element in the reflection region can be removed by dry etching using chlorine. However, the intermediate layer in the reflection region of the mask need not essentially be removed. The reflective-type mask can be used with the intermediate layer also left in the reflection region of the mask (where the pattern of the absorber film is not formed). After forming the pattern of the absorber film, the resist layer left on the pattern of the absorber film is removed. Thus, the reflective-type mask of this invention is obtained.

As described above, by the use of the intermediate layer made of the material containing Ta as a main metal element, which is easy in control of the stress, high in absorption coefficient for light, and excellent in surface smoothness, the reflective multilayer film is prevented from being distorted or warped. By sufficiently reducing the thickness of the intermediate layer, it is possible to obtain the reflective-type mask capable of carrying out pattern transfer with high accuracy without causing the contrast and the decrease in positional accuracy resulting from the shadow of the pattern itself and without increasing edge roughness of the surface of the absorber film and to obtain the reflective-type mask blank for use in producing the reflective-type mask.

Hereinafter, specific examples of this invention will be described in detail with reference to FIGS. 1 through 5.

1ST EXAMPLE

Referring to FIG. 1, a substrate 1 used in this example was a $SiO_2$—$TiO_2$ based glass substrate having an outer dimension of 6-inch square and a thickness of 6.3 mm. The glass substrate 1 had a thermal expansion coefficient of $0.2 \times 10^{-7}$/° C. and a Young's modulus of 67 GPa. A principal surface of the glass substrate was subjected to mechanical polishing to have a smooth surface of 0.12 nmRms and a flatness of 100 nm or less.

Next, as a reflective multilayer film 2, a Mo/Si periodic reflective multilayer film was used in this example in order to form the reflective multilayer film adapted to exposure light in a wavelength band of 13–14 nm. The reflective multilayer film 2 was a film comprising Mo films and Si films alternately laminated to have a total thickness of 284 nm. The reflective multilayer film 2 had a reflectivity of 65% for the exposure light having a wavelength of 13.4 nm and an incident angle of 2 degrees. The reflective multilayer film 2 was formed by alternately depositing Mo and Si on the principal surface of the substrate 1 by using DC magnetron sputtering. Specifically, a Si film was deposited to the thickness of 4.2 nm by the use of a Si target in an Ar gas atmosphere kept at a pressure of 0.1 Pa. Then, a Mo film was deposited to the thickness of 2.8 nm by the use of a Mo target in an Ar gas atmosphere kept at a pressure of 0.1 Pa. The above-mentioned deposition of the single Si film and the single Mo film is defined as a single period. After deposition of 40 periods, another Si film was finally deposited.

An intermediate layer 3 formed on the reflective multilayer film 2 was made of Ta4B and had a thickness of 3 nm. The intermediate layer 3 was deposited by DC magnetron sputtering using a Ta4B sintered target. Prior to deposition, the relationship between the film stress and the supply power to the target was obtained to determine the supply power (2 kW) corresponding to the film stress substantially equal to zero. Deposition was carried out by the use of an Ar gas as a sputter gas under the condition of a sputter gas pressure of 0.2 Pa, a supply power of 2 kW, and a deposition start temperature of 22° C. It has been confirmed by the X-ray diffraction analysis that the intermediate layer 3 formed as mentioned above had a composition ratio substantially identical with that of the target and an amorphous structure.

The intermediate layer 3 had a surface roughness of 0.15 nmRms and an absorption coefficient of 0.037 for the exposure light having a wavelength of 13.4 nm. An absorber film 4 formed on the intermediate layer 3 was made of CrN and had a thickness of 90 nm. The absorber film 4 was deposited by DC magnetron sputtering using a Cr target. Prior to deposition, it was experimentally confirmed that a resultant total stress of the substrate and other films than the intermediate layer 3 would not cause deformation. Therefore, the internal stress of the intermediate layer 3 was controlled to be substantially equal to zero. The correlation between the internal stress and the gas pressure was preliminarily obtained.

As a sputter gas, use was made of a mixed gas containing Ar with 20% nitrogen added thereto. A sputter gas pressure was 0.3 Pa. It was confirmed by the X-ray diffraction analysis that the deposited film had a composition of $Cr_{1-x}N_x$ where x was equal to 0.1 and a fine crystal structure. The film stress obtained by measuring the warp of the substrate using a laser interferometer was substantially equal to zero. The absorber film 4 had a surface roughness of 0.2 nmRms. The total thickness of the intermediate layer 3 and the absorber film 4 was equal to 53 nm. Thus, a reflective-type mask blank 10 of this invention was obtained.

Figure 2:
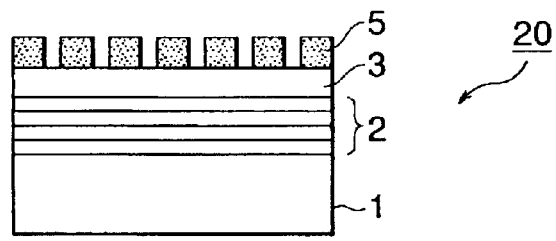
FIG. 2 is a sectional view of a first reflective-type mask formed by the mask blank in FIG. 1.

Next referring to FIG. 2, description will be made of a method of producing a reflective-type mask 20. The reflective-type mask 20 has a pattern for a 16 Gbit-DRAM having a design rule of 0.07 μm. At first, an EB (Electron Beam irradiation) resist was applied onto the absorber film 4 of the above-mentioned reflective-type mask blank 10. A resist pattern was formed by EB writing and development. Using the resist pattern as a mask, the absorber film was dry-etched using an etching gas containing chlorine and oxygen to form an absorber film pattern on the absorber film 4. The dry etching was carried out under the condition of a gas pressure of 0.5 Pa, a substrate temperature of 20° C., and an RF bias of 5 W.

The Ta4B film as the intermediate layer was exposed to the etching gas as a result of over-etching. However, the reduction in thickness was on the order of 1 nm and the Ta4B film was substantially retained. After the etching, the Ta4B film had a surface roughness of 0.16 nmRms. Next, the resist pattern remaining on the absorber film pattern was removed by the use of a hot sulfuric acid at 100° C. Thus, the reflective-type mask 20 having the structure illustrated in FIG. 2 was obtained. By the use of the reflective-type mask 20, the reflectivity was measured by a reflectometer with respect to the EUV light having a wavelength of 13.4 nm and an incident angle of 2 degrees. As a result, the reflectivity was equal to 62%.

Figure 3:
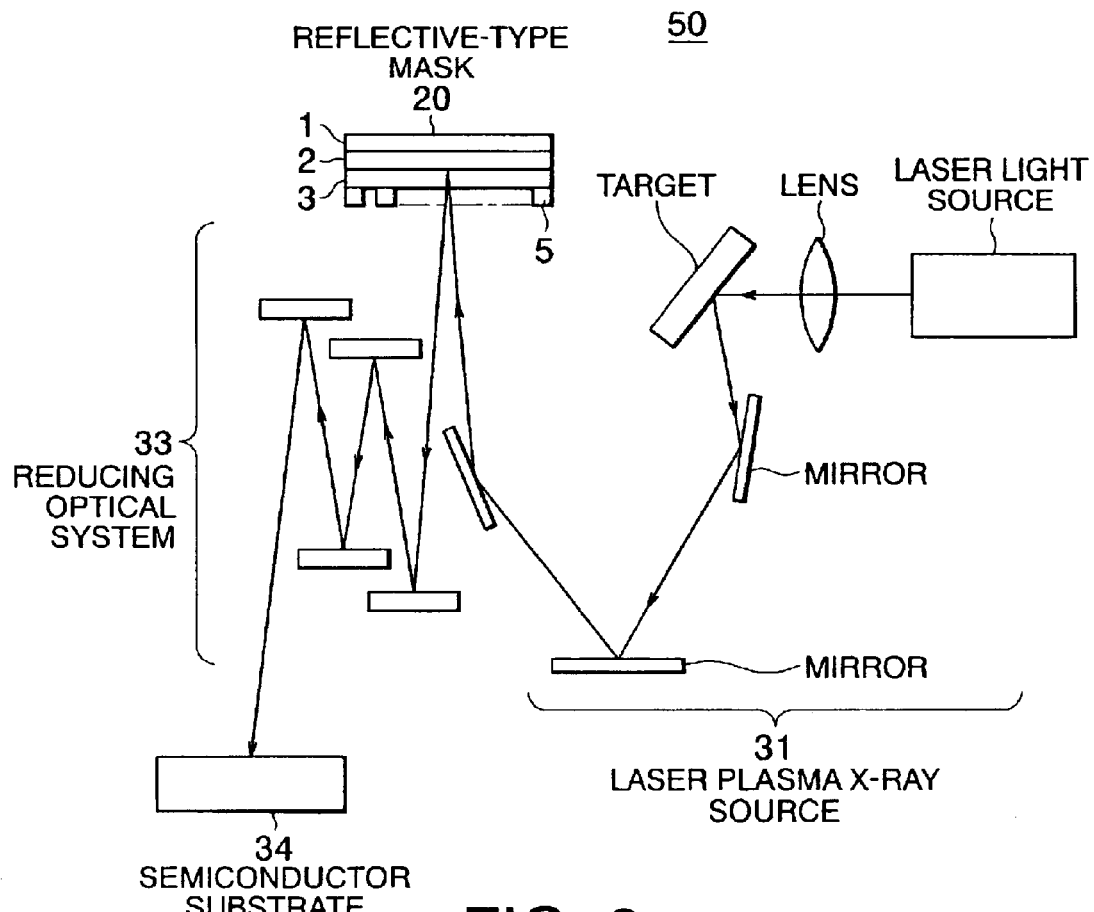
FIG. 3 is a view for describing a pattern transfer method using the reflective-type mask of FIG. 1.

Next referring to FIG. 3, description will be made of a method of transferring a pattern on a semiconductor substrate 34 with a resist by the use of the reflective-type mask 20 and the EUV light. A pattern transfer apparatus 50 comprises a laser plasma X-ray source 31, the reflective-type mask 20, and a reducing optical system 33. As the reducing optical system 33, an X-ray reflection mirror may be used. While the light reflected by the reflective-type mask 20 passes through the reducing optical system 33, the pattern is typically reduced to about ¼. Since the wavelength band of 13–14 nm is used as the exposure wavelength, the apparatus is arranged so that an optical path is positioned in vacuum.

In the above-mentioned condition, the EUV light emitted from the laser plasma X-ray source 31 is incident to the reflective-type mask 20. The light reflected by the reflective-type mask 20 passes through the reducing optical system 33 and is directed to the Si wafer 34 to transfer the pattern. The light incident to the reflective-type mask 32 in the absorption region where the absorber film pattern 5 is present is absorbed by the absorber film 5 and is not reflected. On the other hand, the light incident in the reflection region where the absorber film 5 is not formed is reflected by the reflective multilayer film 2. The light reflected by the reflective-type mask 20 and forming an image of the pattern is incident to the reducing optical system 33. Then, the light is directed to the resist layer formed on the Si wafer 34. In this manner, the pattern is transferred to the resist layer by exposure. By development, a resist pattern is obtained. By the above-mentioned pattern transfer onto the semiconductor substrate, the reflective-type mask 20 is expected to have an accuracy which does not exceed 16 nm as required in the 70 nm design rule.

2ND EXAMPLE

Figure 4:
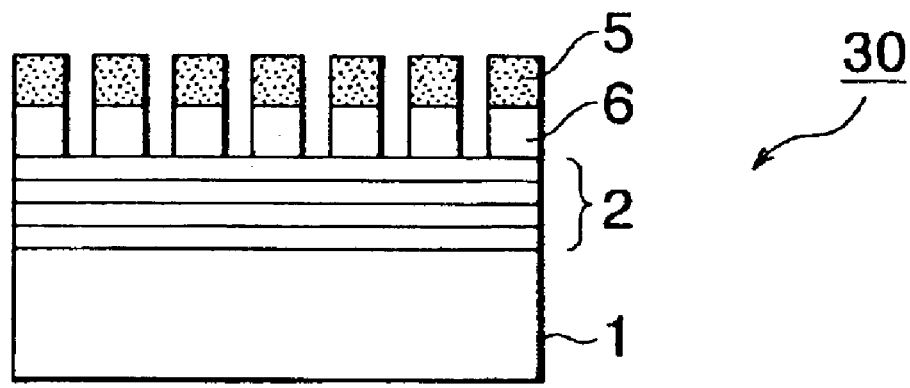
FIG. 4 is a sectional view of a second reflective-type mask formed by the mask blank in FIG. 1.

Referring to FIG. 4, a reflective-type mask 30 in this example is basically different from the reflective-type mask 20 in the first example in that the intermediate layer is partially removed in conformity with the absorber film pattern. As other differences, the Ta4B intermediate layer has a thickness of 50 nm, the CrN absorber film has a thickness of 50 nm, the internal stresses of the Ta4B intermediate layer and the CrN absorber film are −100 MPa and +100 MPa per the thickness of 100 nm. The reflective-type mask blank was produced in the manner similar to the first example except the differences mentioned above.

Next, the reflective-type mask 30 illustrated in FIG. 4 was produced from the reflective-type mask blank. Unlike the first example, the intermediate layer in the reflection region was removed by dry etching using chlorine in conformity with the absorber film pattern to form an intermediate film pattern 6. Thus, the reflective-type mask 30 illustrated in FIG. 4 was obtained. The dry etching was carried out under the condition of a gas pressure of 0.1 Pa, a substrate temperature of 20° C., and an RF bias of 50 W.

By the use of the reflective-type mask 30, the reflectivity was measured for the EUV light having a wavelength of 13.4 nm and an incident angle of 2 degrees. As a result, the reflectivity was equal to 63%. Like in the first example, it is expected that, if the pattern transfer onto the Si wafer is carried out by the use of the transfer apparatus illustrated in FIG. 3, the reflective-type mask in this example has an accuracy which does not exceed 16 nm as required in the 70 nm design rule.

3RD EXAMPLE

Figure 5:
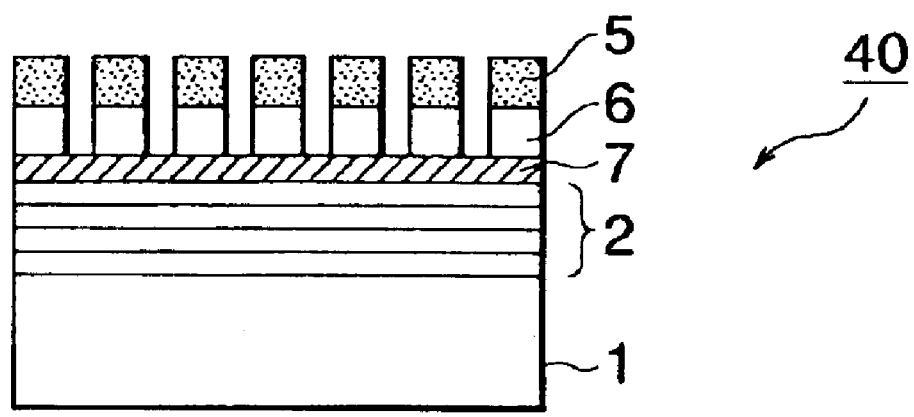
FIG. 5 is a sectional view of a third reflective-type mask formed by the mask blank in FIG. 1.

Referring to FIG. 5, a reflective-type mask 40 in this example is basically different from the second example in that an underlayer 7 is formed between the intermediate layer and the reflective multilayer film to serve as an etch stopper layer for protecting the reflective multilayer film when the intermediate layer is removed by etching. As other differences, the Ta4B intermediate layer has a thickness of 45 nm, the CrN absorber film has a thickness of 50 nm, the internal stresses of the Ta4B intermediate layer and the CrN absorber film are +200 MPa and −200 MPa per the thickness of 100 nm, respectively. The reflective-type mask blank was produced in the manner similar to the second example except the differences mentioned above.

The underlayer 7 comprising a CrN film and having a thickness of 3 nm was formed on the reflective multilayer film. The underlayer 7 was deposited by DC magnetron sputtering using a Cr target. The sputtering was carried out by the use of a sputter gas containing Ar with 20% N added thereto and kept at a pressure of 0.3 Pa. The deposited film had a composition of $Cr_{1-x}N_x$ where x was equal to 0.1 and a fine crystal structure. The film stress was substantially equal to zero. Next, on the underlayer 7, the Ta4B intermediate layer and the CrN absorber film having the above-mentioned thicknesses and the film stresses were formed in the manner similar to the second example. Thus, the reflective-type mask blank of this example was obtained.

The absorber film 5 had a surface roughness of 0.20 nmRms. Next, the reflective-type mask 40 illustrated in FIG. 5 was produced from the above-mentioned reflective-type mask blank. The patterns of the absorber film and the intermediate layer were formed in the manner similar to the first and the second examples. However, unlike the second example, the intermediate layer was partially removed or patterned with the underlayer 7 used as an etch stopper layer. In the above-mentioned manner, the reflective-type mask 40 in this example was obtained. In the reflective-type mask 40, the underlayer 7 was not removed but was left on the reflective multilayer film.

By the use of the reflective-type mask 40, the reflectivity was measured for the EUV light having a wavelength of 13.4 nm and an incident angle of 2 degrees. As a result, the reflectivity was equal to 63%. Like in the first example, it is expected that, if pattern transfer onto the semiconductor substrate is carried out using the transfer apparatus illustrated in FIG. 3, the reflective-type mask would have an accuracy which does not exceed 16 nm as required in the 70 nm design rule.

In this example, the underlayer resistant against the etching condition of the intermediate layer is inserted between the intermediate layer and the reflective multilayer film. With this structure, the intermediate layer can be patterned without damaging the reflective multilayer film at all. As a consequence, the reflective multilayer film can be re-used or recycled. The underlayer also serves as a protection film for the reflective multilayer film during mask cleaning.

Comparative Example

In a comparative example, a reflective-type mask blank similar in structure to that of the second example (FIG. 4) was produced except that the intermediate layer was made of $SiO_2$. The $SiO_2$ intermediate layer was deposited by RF magnetron sputtering by the use of a $SiO_2$ target without controlling the film stress. The $SiO_2$ intermediate layer had a small absorption coefficient of 0.012 for the light having a wavelength of 13.4 nm. Therefore, in case where the CrN absorber film had a thickness of 50 nm, the $SiO_2$ layer was as thick as 100 nm in order to obtain sufficient light absorption characteristic. The $SiO_2$ intermediate layer thus formed had a surface roughness as large as 0.5 nmRms and the film stress as very large as −600 MPa per the thickness of 100 nm.

On the $SiO_2$ intermediate layer, the absorber film similar to the absorber film 4 in the first example (FIG. 1) was formed. The absorber film had a surface roughness as very large as 0.65 nmRms. The total thickness of the intermediate layer and the absorber film was as thick as 150 nm. The absorber film was patterned by dry etching using a gas containing chlorine and oxygen with the $SiO_2$ intermediate layer used as an etch stopper layer. After forming the pattern, the $SiO_2$ intermediate layer was reduced in thickness by about 1 nm. The surface roughness was 0.55 nmRms.

Next, by dry etching using a $CF_4+O_2$ gas, the $SiO_2$ intermediate layer in the reflection region of the mask was removed. By the use of the mask, the reflectivity was measured for the EUV light having a wavelength of 13.4 nm and an incident angle of 2 degrees. As a result, the reflectivity was equal to 60%.

By pattern transfer onto the semiconductor substrate illustrated in FIG. 5, a sufficient positional accuracy and a sufficient contrast would not be obtained due to the deformation of the surface of the reflective multilayer film resulting from a large residual stress in the intermediate layer and a surface roughness of the absorber film. It is therefore impossible to meet the accuracy of 16 nm as required in the 70 nm design rule.

According to this invention, it is possible, by the use of the intermediate layer made of a material containing Ta as a main metal element, to provide a reflective-type mask prevented from being deformed due to the film stress or the like and a reflective-type mask blank for use in producing the reflective-type mask. It is also possible to provide a reflective-type mask capable of preventing the decrease in pattern accuracy and a reflective-type mask blank for use in producing the reflective-type mask. It is also possible to provide a reflective-type mask suppressed in decrease of the reflective characteristic and having high reliability and a reflective-type mask blank for use in producing the reflective-type mask. By the use of the reflective-type mask of this invention, it is possible to carry out pattern transfer onto a semiconductor substrate or the like with high accuracy.

What is claimed is:

1. A reflective-type mask blank for exposure which blank comprises:
   a substrate having a principal surface;
   a reflective multilayer film formed on said principal surface for reflecting exposure light which travels from the outside of said reflective-type mask blank towards said principal surface; and
   an absorber film formed on said reflective multilayer film for absorbing said exposure light;
   wherein said blank further comprises:
   an intermediate layer which is interposed between said reflective multilayer film and said absorber film and which is resistant against an etching environment of said absorber film, said intermediate layer being made of a material comprising Ta as a main metal component.

2. A reflective-type mask blank as claimed in claim 1, wherein the material of said intermediate layer further comprises B as another component.

3. A reflective-type mask blank as claimed in claim 1, wherein said intermediate layer has an amorphous structure or a fine crystal structure.

4. A reflective-type mask blank as claimed in claim 1, wherein said absorber film is made of a material comprising Cr as a main metal component.

5. A reflective-type mask blank as claimed in claim 4, wherein the material of said absorber film further comprises at least one element selected from the group consisting of N, O, and C.

6. A reflective-type mask produced by forming a transfer pattern in the absorber film of a reflective-type mask blank as claimed in any one of claims 1 to 5.

7. A method of producing a reflective-type mask blank for exposure, which method comprises the steps of:
   preparing a substrate having a principal surface;
   forming on said principal surface a reflective multilayer film reflecting exposure light which travels from the outside of said reflective-type mask blank towards said principal surface; and forming on said reflective multilayer film an absorber film absorbing said exposure light to thereby obtain said reflective-type mask blank;

wherein said method further comprises the step of:

forming an intermediate layer which is interposed between said reflective multilayer film and said absorber film and which is resistant against an etching environment of said absorber film, said intermediate layer being formed by using a material comprising Ta as a main metal component.

8. A method of producing a reflective-type mask blank for exposure, which method comprises the steps of:

preparing a substrate having a principal surface;

forming on said principal surface a reflective multilayer film reflecting exposure light which travels from the outside of said reflective-type mask blank towards said principal surface; and forming on said reflective multilayer film an absorber film for absorbing said exposure light to thereby obtain said reflective-type mask blank;

wherein said method further comprises the step of:

forming an intermediate layer which is interposed between said reflective multilayer film and said absorber film and which is resistant against an etching environment of said absorber film, said intermediate layer being formed by using a material comprising Ta as a main metal component so that a film stress of said intermediate layer is controlled to cancel a film stress of said absorber film formed on said intermediate layer.

* * * * *